United States Patent
Doris et al.

(10) Patent No.: US 10,790,001 B2
(45) Date of Patent: Sep. 29, 2020

(54) TAPERED VA STRUCTURE FOR INCREASED ALIGNMENT TOLERANCE AND REDUCED SPUTTER REDEPOSITION IN MTJ DEVICES

(71) Applicant: International Business Machines Corporation, Armonk, NY (US)

(72) Inventors: Bruce B. Doris, Armonk, NY (US); Pouya Hashemi, Armonk, NY (US); Nathan Philip Marchack, Armonk, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/240,218

(22) Filed: Jan. 4, 2019

(65) Prior Publication Data

US 2020/0219549 A1 Jul. 9, 2020

(51) Int. Cl.
*H01L 43/02* (2006.01)
*H01L 27/22* (2006.01)
*G11C 11/16* (2006.01)
*H01L 43/12* (2006.01)
*H01L 43/08* (2006.01)

(52) U.S. Cl.
CPC .......... *G11C 11/161* (2013.01); *H01L 27/222* (2013.01); *H01L 43/02* (2013.01); *H01L 43/08* (2013.01); *H01L 43/12* (2013.01)

(58) Field of Classification Search
CPC ............... H01L 45/1683; H01L 21/042; H01L 21/3065; H01L 43/12; H01L 43/08; H01L 43/02; H01L 43/10; H01L 27/222; H01L 45/1253; G11C 11/161; G11C 2211/5615
See application file for complete search history.

(56) References Cited

U.S. PATENT DOCUMENTS

| | | | |
|---|---|---|---|
| 6,222,219 B1 | 4/2001 | Gambino et al. | |
| 8,283,186 B2 | 10/2012 | Kim | |
| 8,450,722 B2 | 5/2013 | Liu et al. | |
| 9,564,577 B1* | 2/2017 | Hsu | H01L 43/02 |
| 9,799,824 B2 | 10/2017 | Xia et al. | |
| 9,818,935 B2 | 11/2017 | Chuang et al. | |
| 2007/0166840 A1 | 7/2007 | Assefa et al. | |
| 2017/0084828 A1* | 3/2017 | Hsu | G11C 11/16 |
| 2017/0222128 A1 | 8/2017 | Min et al. | |
| 2017/0309497 A1* | 10/2017 | Dieny | H01L 45/06 |

FOREIGN PATENT DOCUMENTS

| | | |
|---|---|---|
| CN | 102687298 A | 9/2012 |
| CN | 102741934 A | 10/2012 |
| WO | WO2017155508 A1 | 9/2017 |

OTHER PUBLICATIONS

Authorized Officer Yingying Liu, Apr. 15, 2020 International Search Report, Chinese National IP Admin, in counterpart PCT Appln PCT/IB2019/060902, pp. 1-10, international search report and written opinion.

\* cited by examiner

*Primary Examiner* — Caridad Everhart
(74) *Attorney, Agent, or Firm* — Daniel Morris; Otterstedt, Wallace & Kammer, LLP

(57) ABSTRACT

A bottom electrode structure for MRAM or MTJ-based memory cells comprises a taper so that the bottom CD is smaller than the top CD. A process of making a bottom electrode contact structure comprises etching a dielectric layer using a plasma chemistry with an increased degree of polymerization. We obtain a product made by this process.

14 Claims, 12 Drawing Sheets

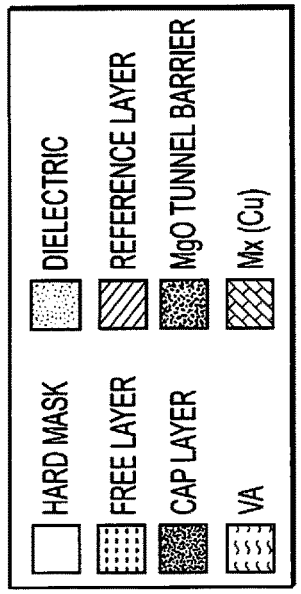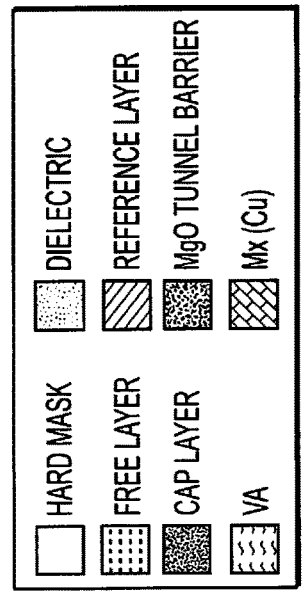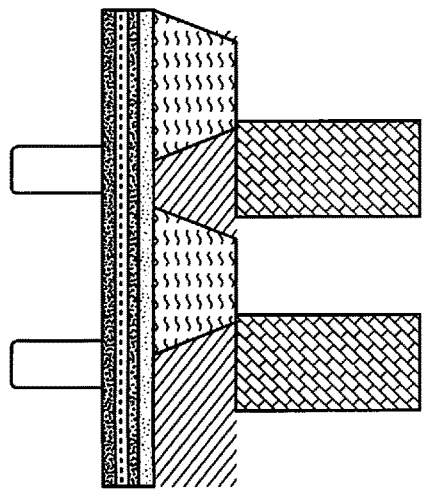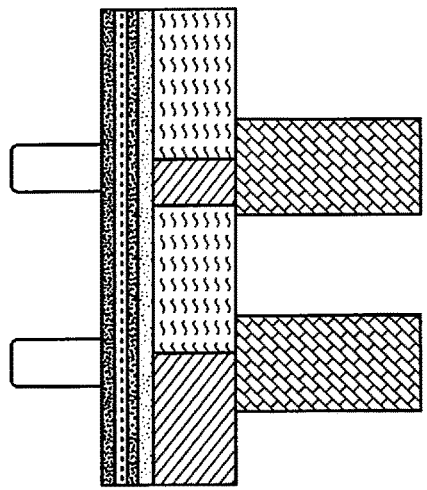
FIG. 3
FIG. 4
(PRIOR ART)

TAPERED VA STRUCTURE FOR INCREASED ALIGNMENT TOLERANCE AND REDUCED SPUTTER REDEPOSITION IN MTJ DEVICES

FIELD OF THE INVENTION

The invention comprises novel integrated circuits and processes for the production of these circuits. In one embodiment the invention comprises processes for manufacturing magnetic tunnel junction (MTJ) based devices used in magnetic random access memory (STT-MRAM) arrays.

BACKGROUND OF THE INVENTION

There are two major categories of computer memory: non-volatile memory and volatile memory. The present invention relates to non-volatile memory, i.e., memory that does not require constant input of energy in order to retain information whereas volatile memory does. In non-volatile memory devices, the memory state can be retained for days to decades without power consumption. Examples of non-volatile memory devices comprise Read Only Memory (ROM), Flash Electrical Erasable Read Only Memory, Ferroelectric Random Access Memory (FRAM), Magnetic Random Access Memory (MRAM), and Phase Change Memory (PCM).

Non-volatile embedded memory, e.g.; on-chip embedded memory with non-volatility can enable energy and computational efficiency. However, there may be density limitations for traditional spin torque transfer magnetoresistive random access memory (STT-MRAM) integration to accommodate large write switching current and select transistor requirements. Specifically, traditional STT-MRAM has a cell size limitation due to the drive transistor requirement to provide sufficient spin current Furthermore, such memory is associated with large write current (>100 uA) and voltage (>0.7 V) requirements of conventional magnetic tunnel junction (MTJ) based devices.

Integrating memory directly onto a microprocessor provides the advantage of enabling much wider busses and higher operation speeds compared to physically separate logic and memory chips. Traditional charge-based memory technologies such as DRAM and NAND Flash now face severe scalability issues due to increasingly precise charge placement and sensing requirements. Embedding charge-based memory directly onto a high performance logic chip is not very attractive for future technology nodes. Spin-torque transfer magnetoresistive random access memory (STT-MRAM), however, has the potential to scale to much smaller geometries compared to traditional charge-based memories, since it relies on resistivity rather than charge as the information carrier. Obtaining the benefits of a high performance logic chip with embedded STT-MRAM memory, however, requires structures comprising appropriate integrated logic means operatively associated with a STT-MRAM, as well as an appropriate fabrication processes.

SUMMARY OF THE INVENTION

In one embodiment, the invention comprises a process of integrating spin torque transfer magnetic random access memory (STT-MRAM) arrays into a logic processor.

Another embodiment of the invention comprises processes of integrating (STT-MRAM) arrays into a logic processor by first employing one or more magnetic tunnel junctions (MTJs) in the process, i.e., a MTJ-first approach. A further embodiment of the invention comprises the structures obtained from the foregoing processes.

An MRAM device comprises multiple MTJs in an array, with each pillar over a bottom electrode which connects to previously fabricated CMOS transistors (the bottom electrode connects to the back end of line [BEOL] metal interconnects, typically patterned by damascene processes (etch vias and trenches in dielectrics and deposited metal in the trenches). Several MTJs comprise an MRAM cell. Pillar refers to the stack of magnetic elements patterned in a cylindrical geometry; the electrode comprises a conducting material used to transfer current through the MTJ device, well-known structures in MTJ and MRAM devices which we discuss below.

In another embodiment the invention comprises a tapered VA structure formed by damascene patterning which provides a larger process window for alignment compared to one with vertical sidewalls, especially at tighter pitches as later described and illustrated in the drawings. An additional benefit of the tapered structure can be seen for various scenarios of misalignment, where in the case of overetch into the VA, the exposed metal area vs. dielectric is lower than that of the vertical sidewall VA.

Allenspach et al., U.S. Pat. No. 10,109,786 describe and define the "spin transfer torque" or "STT" and "magnetic tunnel junction" or "MTJ" technologies referred to herein; Kim, U.S. Pat. No. 8,283,186 also describe and define the "spin transfer torque" or "STT" technologies referred to herein; Qi, et al. U.S. Pat. No. 6,697,294 describe and define the "magnetoresistive random access memory" or MRAM technologies referred to herein.

RELATED ART

The following patents and published applications provide examples of the state of the art in the field of the invention:
Allenspach. et al., U.S. Pat. No. 10,109,786;
Hsu, et al., U.S. Pat. No. 9,564,577;
Kim, U.S. Pat. No. 8,283,186;
Liu, et al. U.S. Pat. No. 8,450,722;
Chuang, et al., U.S. Pat. No. 9,818,935;
Sung, et al., US Pat. App. 2017/0222128;
Gambino, et al., U.S. Pat. No. 6,222,219;
Lee, et al., WO 2017/155508; and
Xia, et al., U.S. Pat. No. 9,799,824.
Qi, et al., U.S. Pat. No. 6,997,294.

BRIEF DESCRIPTION OF THE DRAWINGS

The accompanying drawings are not necessarily drawn to scale but nonetheless set out the invention, and are included to illustrate various embodiments of the invention, and together with this specification (i.e., "Written Description" and "Claims") also serve to explain the principles of the invention.

FIGS. 1, 3, 5, 7, and 9 comprise side elevations in cross-section illustrating the tapered VA structure of the invention that enables increased alignment tolerance and reduced sputter redeposition of conductive material in MTJ devices. "Reduced sputter redeposition" refers to reducing the amount of redeposited conducting material caused by physical sputtering of layers underneath the MTJ stack. The primary patterning method for the MTJ devices is physical sputtering (a nonselective etch method) so the underlying material layers are vulnerable to being sputter etched once the stack has been patterned. If the underlying material is conductive, this sputtered material can be redeposited on the sidewall of the MTJ device. However, if the sputtered material is insulating (e.g. dielectric) then this will not pose a problem.

FIGS. 2, 4, 6, 8, and 10 comprise side elevations in cross-section illustrating prior art VA structures for comparison to the structures or articles of manufacture of the present invention illustrated in FIGS. 1, 3, 5, 7, and 9 respectively.

Figure 1:
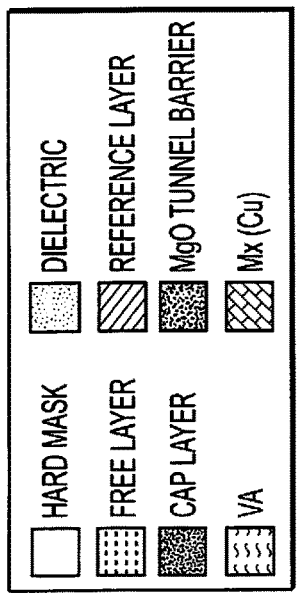
Figure 1:
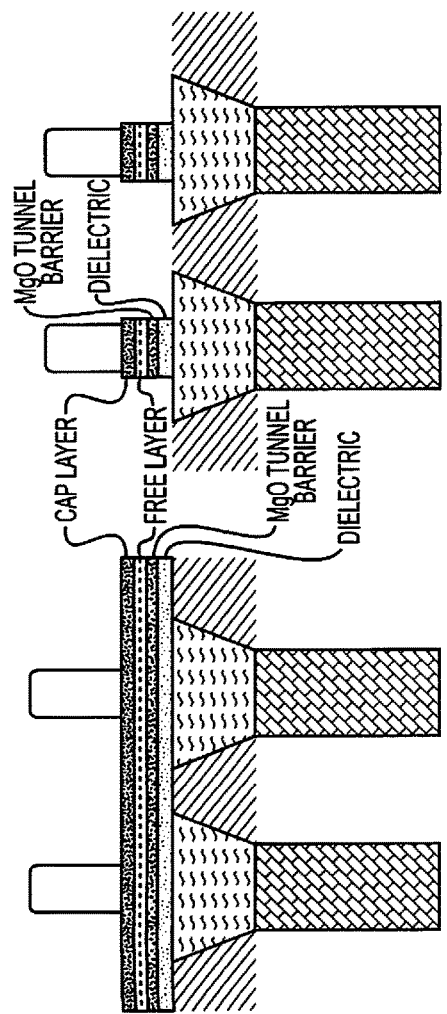

The FIG. 1 layers labeled as "CAP LAYER," "FREE LAYER," MgO TUNNEL BARRIER," and "DIELECTRIC," also identify the similarly shaded layers of FIGS. 2-10.

FIGS. 11-17 comprise side elevations in cross-section illustrating structures depicting the manufacture of the MTJ devices of the present invention.

DETAILED DESCRIPTION OF THE INVENTION

The present invention comprises structures, articles of manufacture, processes and products produced by the processes that address the foregoing needs, To achieve the foregoing and other advantages, and in accordance with the purpose of this invention as embodied and broadly described herein, the following detailed description comprises disclosed examples of the invention that can be embodied in various forms.

The specific processes, compounds, compositions, and structural details set out herein not only comprise a basis for the claims and a basis for teaching one skilled in the art to employ the present invention in any novel and useful way, but also provide a description of how to make and use this invention. Not only do the written description, claims, abstract of the disclosure, and the drawings that follow set forth various features, objectives, and advantages of the invention and how they may be realized and obtained, but these features, objectives, and advantages will also become apparent by practicing the invention.

The invention takes into account that as pitch scales downwardly, alignment of various modules, i.e., the devices produced according to our invention, becomes more of an issue for subtractive patterning schemes. "Pitch" refers to the spacing between two individual device features, in this case, MTJ pillars, measured from the center of each feature. As an example, a pitch of 100 nm for pillars of 50 nm diameter means there is actually 50 nm of space between the outer wall of each pillar. One such module comprises the "VA" or bottom electrode/landing pad utilized in memory cell technologies such as STT-MRAM. This module is critical as it provides a suitable surface for depositing the memory element and provides contact to the underlying metal level. The prior art VA also provides a potential yield detractor as resputtered material can deposit on the sidewall of the memory element, i.e., in resputtering, the larger bottom surface of the prior art VA provides a larger source of conductive material compared to the smaller bottom surface of the tapered VA of the present invention, In the case of STT-MRAM this can create shorts across the tunnel barrier which renders the device inoperable.

By "resputtering" we mean physical displacement of atoms from the bottom electrode surface due to exposure to energetic ions used to pattern the stack. The displaced atoms then potentially land on the sidewall of the MTJ device. FIGS. 1, 3, 5, 7, and 9 show this process.

In one aspect, the present invention comprises a process of making a tapered VA having a reduced area bottom electrode contact structure by a process comprising etching a dielectric layer employed in the formation of the VA. The process comprises the use of organic gas plasma chemistry that increases the degree of polymerization of the plasma. Organic gas plasma discharges produce simultaneous etching and deposition reactions. For instance, a fluorocarbon gas of general formula $G_xH_yF_z$ under certain conditions deposits a fluorocarbon polymer layer on the surface treated by the plasma. In one embodiment we use a mixture comprising $CF_4:CHF_3$. Although we use these fluorocarbons in a ration of 1:4, we can vary that ratio by changing each or both by about 10 to about 20 per-cent.

Typically, when etching an opening in a dielectric layer, conditions are chosen to ensure vertical sidewalls in the opening, however, adjusting parameters such as operating pressure, source and bias power, and chemistry ratio can create increased polymer film deposition on the sidewalls of the opening, thus creating a tapered opening having a smaller bottom CD. We then fill the tapered openings with a conductive metal to form the VA.

The taper forms by reducing the bias power to decrease the anisotropic contribution of energetic ions, and by having an increased pressure to reduce the degree of ionization in the plasma. Both of these adjustments lead to the promotion of fluorocarbon film deposition through reactions of neutral and and radical species, which happens predominantly on the sidewall of the etched via structure due to the isotropic angular distribution of those species. As the fluorocarbon film continues to be deposited on the sidewall of the via as etching proceeds in the vertical direction, the result is a tapered structure.

In the Figs., the surface area of the VA facing the Mx posts comprises the bottom of the VA, whereas the surface area of the VA facing the Hardmask comprises the top of the VA The surface area of the top and bottom of the prior art VA is substantially the same, whereas the surface area of the bottom of the VA is substantially less than the surface area of the top of the VA in the present invention. We use these definitions of "top" and "bottom" when describing the VAs throughout this entire specification and the attached drawings. When compared to the prior art VA, the present invention VA reduces the available area of conductive material at the bottom for resputtering, and substantially reduces the potential or actual severe overetch into the underlying layers. The comparable larger surface area of the bottom of the prior art VA comprises the "potential yield detractor."

In one embodiment the invention comprises a tapered VA structure or structures formed by damascene patterning which provides a larger process window for alignment compared to one with vertical sidewalls, especially at tight pitches, i.e., smaller distance between cells. For MRAM devices tight pitch comprises a pitch below about 100 nm.

The present specification and attached drawings describe and illustrate the foregoing as well as additional benefits of the tapered VA structure, e.g., various scenarios of misalignment as illustrated in the Figs., and in the case of over-etch into the VA, the exposed metal area compared to the dielectric is lower than that of the vertical sidewall VA. By thid we mean the metal surface is the only surface that produces conductive material, which can create a short by landing on the tunnel barrier of the device. Thus, if you have a lower ratio of exposed metal to dielectric, there is less chance of creating shorts. The vertical sidewall has a higher exposed metal to dielectric ratio and thus has a higher chance of creating shorts.

The tapered VA structure facilitates metal fill through standard deposition techniques compared to a vertical sidewall which can create voids thereby increasing the resistance values of the electrode. The present invention minimizes or substantially eliminates these voids.

Figure 2:
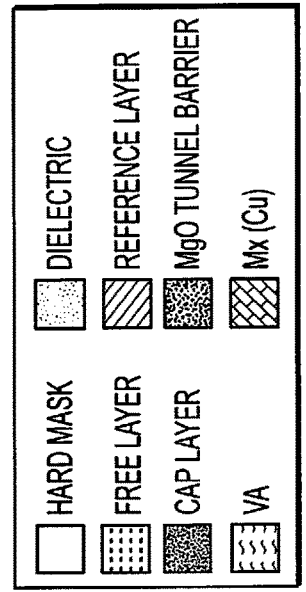
Figure 2:
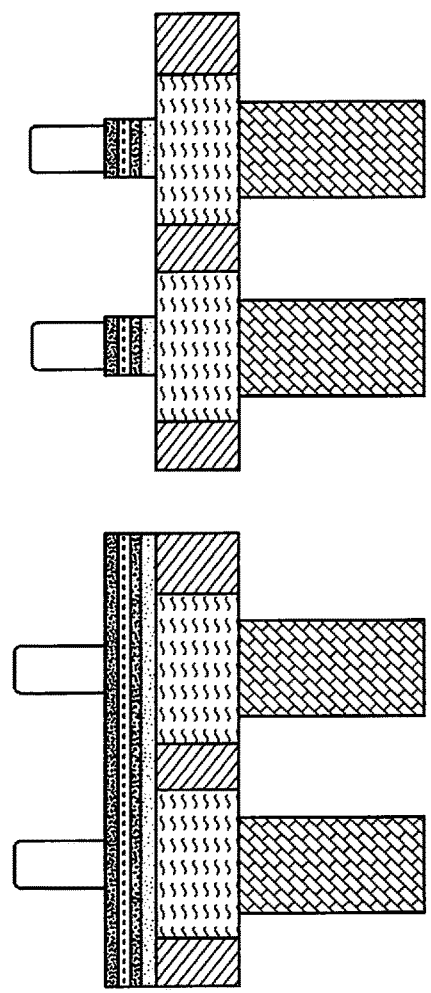

FIGS. 1 and 2 illustrate the case of perfect alignment between the VA, Hardmask and underlying metal (Mx); there is no difference in the alignment of the VA structures of the invention (FIG. 1) and the prior art (FIG. 2). This assumes the top CD of the VA structure is the same in FIGS. 1 and 2 and the taper in FIG. 1 creates a reduction of the bottom CD. "CD" refers to "critical dimension," which in this case comprises the diameter; however, in general it also refers to or comprises substantially the smallest obtainable feature for the particular mask set. Additionally, there are larger restrictions on patterning the VA which is a hole feature as opposed to the metal level which is a line. Thus, to achieve good circularity of the VA, the diameter is expected to exceed the underlying metal line or post CD. These FIG. 1 and FIG. 2 parameters apply to the other FIGS. 3-10.

FIGS. 3 and 4 illustrate in the case of severe misalignment of the VA to the bottom metal level, a scenario whereby the VA structure with vertical sidewalls touches two Mx levels simultaneously, impeding correct function of the device. The tapered VA structure increases the margin for error while allowing contact to be made.

Figure 5:
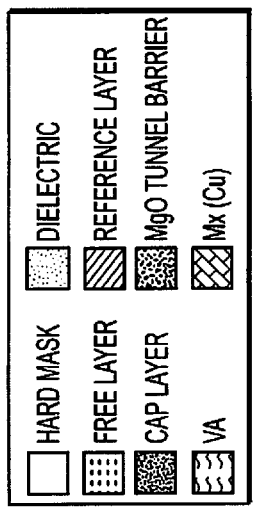
Figure 5:
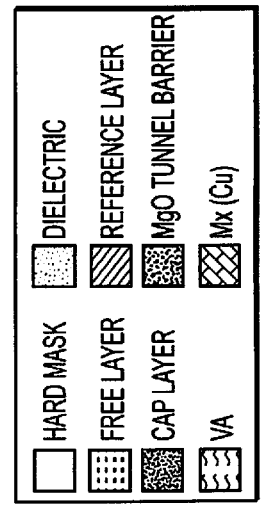
Figure 5:
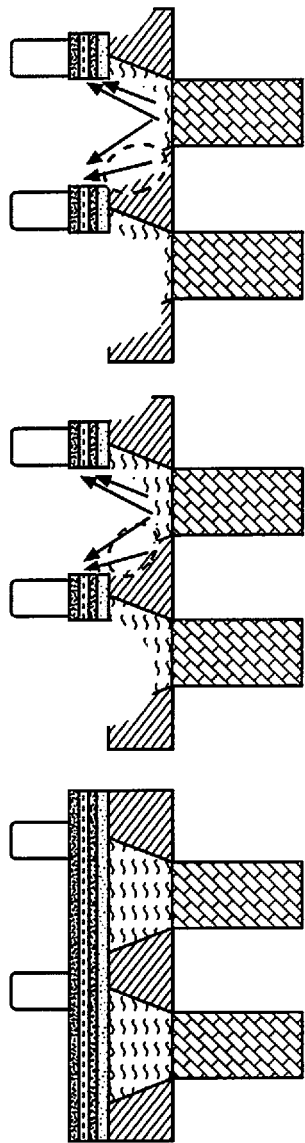
Figure 6:
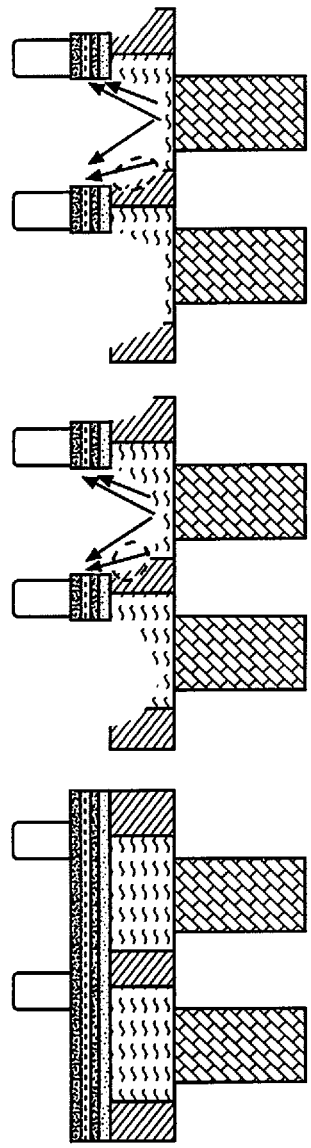

FIGS. 5 and 6 illustrate the second benefit of this structure occurs for a process where significant OE (overetch) into the VA occurs during patterning. Overetch comprises the time after a defined endpoint for etching, usually added to account for film non-uniformity or to remove residues that may be present on the surface; "endpoint" comprises a type of signal (usually from optical emission spectroscopy or mass spectroscopy) that signifies a layer has been etched through (e.g., if an element at the bottom of the MTJ stack is no longer detected by mass spectroscopy it is an indication the etch has completed). FIGS. 5 and 6 further illustrate scenario 1: The Hardmask is misaligned but the VA/Mx is aligned properly. As OE progresses the ratio of dielectric to VA metal exposed is higher for the tapered VA structure, albeit to a very small degree, which we illustrate by dashed circles. Material will be resputtered from the bottom of the trench (depicted by arrows) and potentially land on the sidewall of the MTJ. Any conductive material which lands on the MgO tunnel barrier has the potential to create a short. Thus a higher ratio of exposed dielectric to metal is preferable for a lower probability of shorting.

Figure 7:
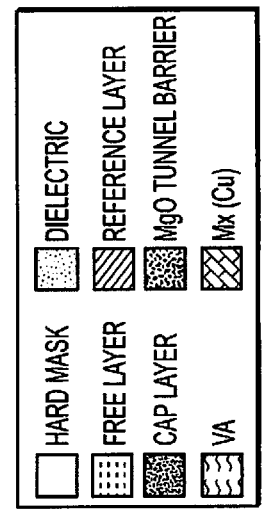
Figure 7:
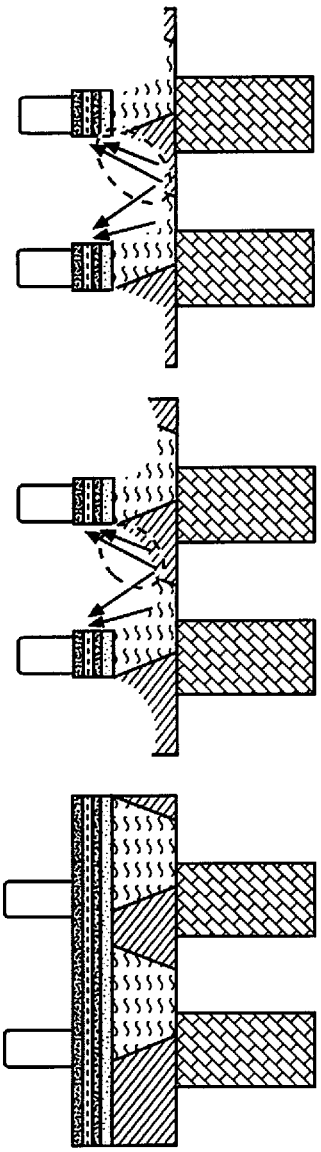
Figure 8:
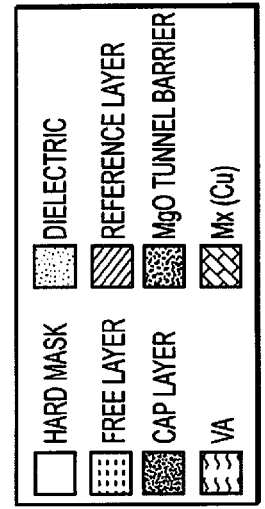
Figure 8:
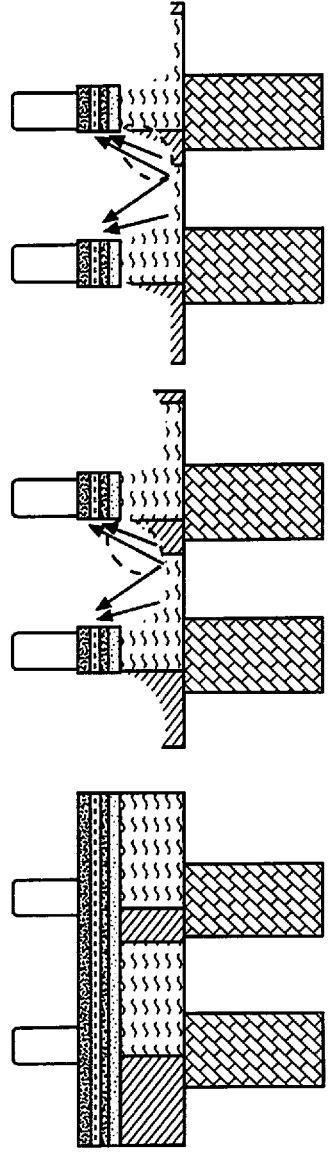

FIGS. 7 and 8 illustrate scenario 2 where the Hardmask is aligned to Mx but the VA is misaligned. As OE progresses it becomes apparent that the ratio of dielectric to VA metal exposed is higher for the tapered VA structure (larger degree than scenario 1 as illustrated by the dashed circles). Material will be resputtered from the bottom of the trench (depicted by arrows) and potentially land on the sidewall of the MTJ. Any conductive material which lands on the MgO tunnel barrier has the potential to create a short. Thus a higher ratio of exposed dielectric to metal is preferable for a lower probability of shorting.

Figure 9:
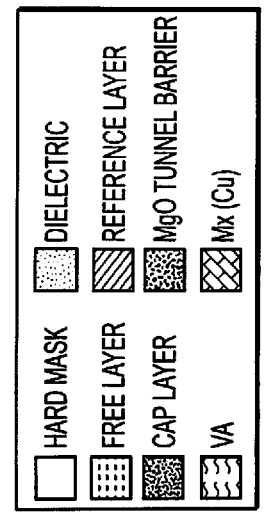
Figure 9:
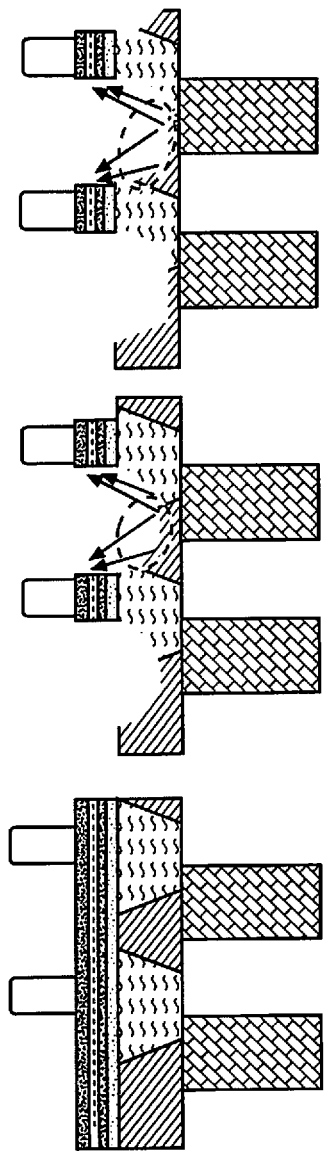
Figure 10:
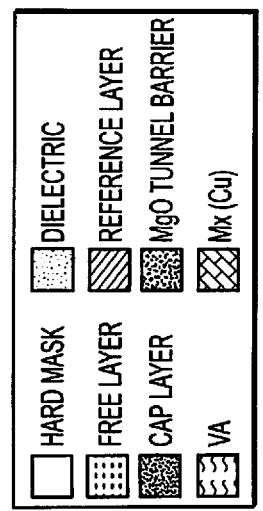
Figure 10:
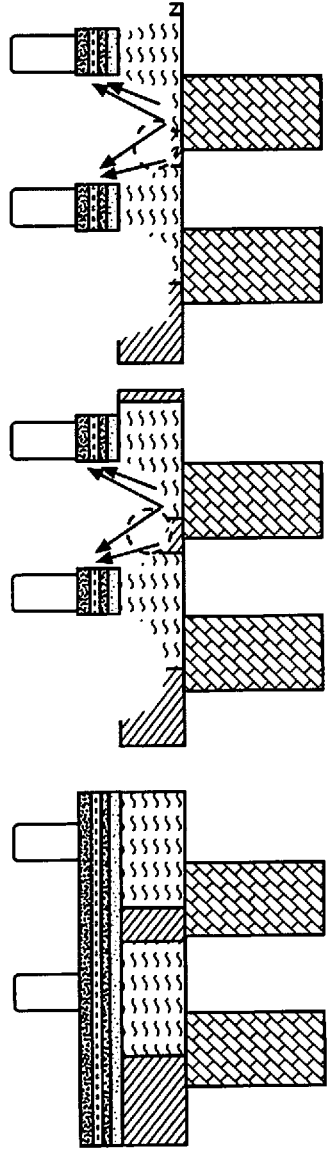

FIGS. 9 and 10 illustrate scenario 3 where both VA and Hardmask are misaligned to Mx. As OE progresses it is apparent that the ratio of dielectric to VA metal exposed is higher for the tapered VA structure (larger degree than Scenario 2 illustrated by dashed circles). OE progression also cause resputtering of material from the bottom of the trench (depicted by arrows) that potentially can land on the sidewall of the MTJ. Any conductive material landing on the MgO tunnel barrier has the potential to cause a short. Thus a higher ratio of exposed dielectric to metal lowers the probability of shorting.

FIGS. 11-17 illustrate covering the VA structure formed according to our invention described herein (e.g., FIG. 10) with a MTJ stack. We now describe this VA structure in FIGS. 11-17 as a "BEOL dielectric/Mx metal."

Figure 11:
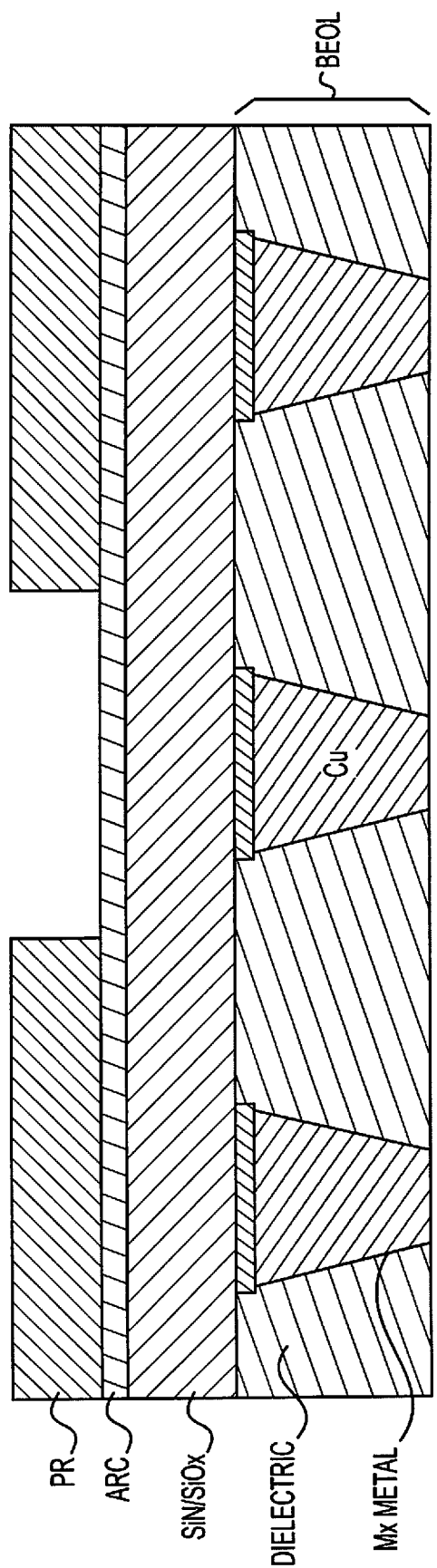

FIG. 11 illustrates a side elevation in cross-section of layers of a microcircuit device or module in a second process flow outline wherein we construct a bottom electrode for contact with the VA structure of the invention by sequentially depositing SiN (or SiOx), ARC, and PR layers on this VA structure. This module comprises 200 mm wafers with CMOS and BEOL interconnects already patterned. We use it to transfer a via (hole) pattern through SiN (or SiOx) to create a reduced CD bottom electrode. In the Figs. ARC=Antireflective Coating, PR=Photoresist, CMOS=Complementary Metal-Oxide-Semiconductor, and BEOL=Back End Of the Line.

Figure 12:
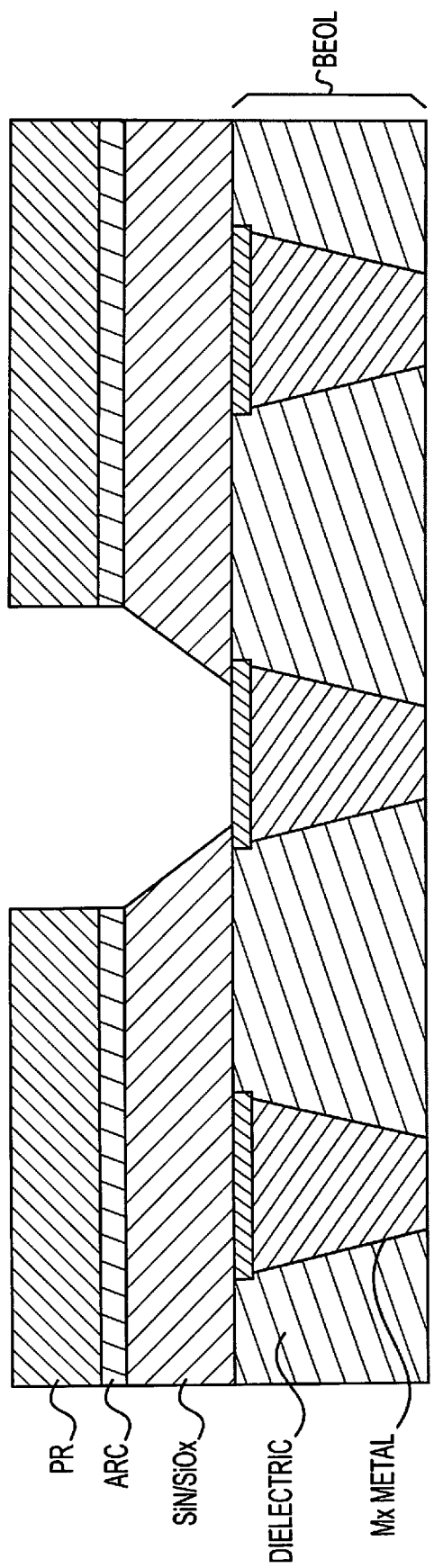

FIG. 12 illustrates a side elevation in cross-section of layers of a microcircuit device or module in the second process flow outline, wherein we process the module of FIG. 11 by plasma etching the SiN (or SiOx) using a high ratio of $CHF3/CF_4$ to inert gas in the plasma to create the opening shown. This creates a tapered profile in the opening and shrinks its initial CD. We can adjust the gas chemistry, however, to obtain a non-tapered profile in the opening.

Figure 13:
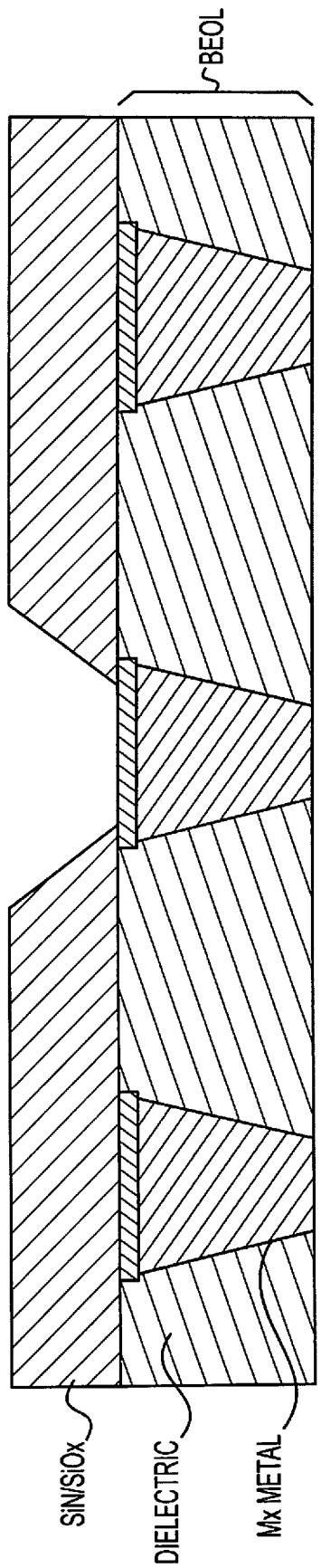

FIG. 13 illustrates a side elevation in cross-section of layers of a microcircuit device or module in the second process flow outline, wherein we process the module of FIG. 12 by stripping away the PR/ARC layers using a downstream plasma. followed by subjecting the wafers or modules to DHF (dilute hydrofluoric acid) to remove any RIE (reactive ion etch) residue from the bottom of the via or opening. Any insulating RIE residues present on the bottom TaN (the capping layer of the Cu) will create an electrical open. An electrical open refers to the path of current disrupted due to the presence of insulating material (in this case the RIE residues).

Figure 14:
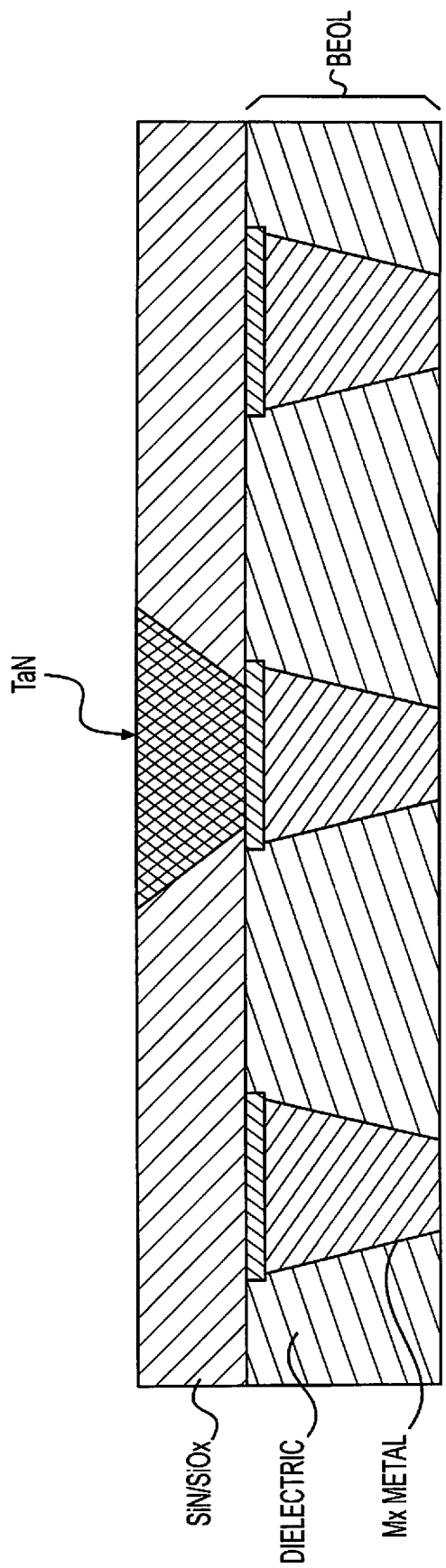

FIG. 14 illustrates a side elevation in cross-section of layers of a microcircuit device or module in the second process flow outline, wherein we process the module of FIG. 13 by filling the via or opening with a conductive metal (e.g. TaN) which we then polish to create a reduced CD bottom electrode (i.e. a tapered structure whereby the bottom CD is less than the top CD). This creates a reduced metal to dielectric ratio if the structure is exposed as described previously regarding FIGS. 5-7.

Figure 15:
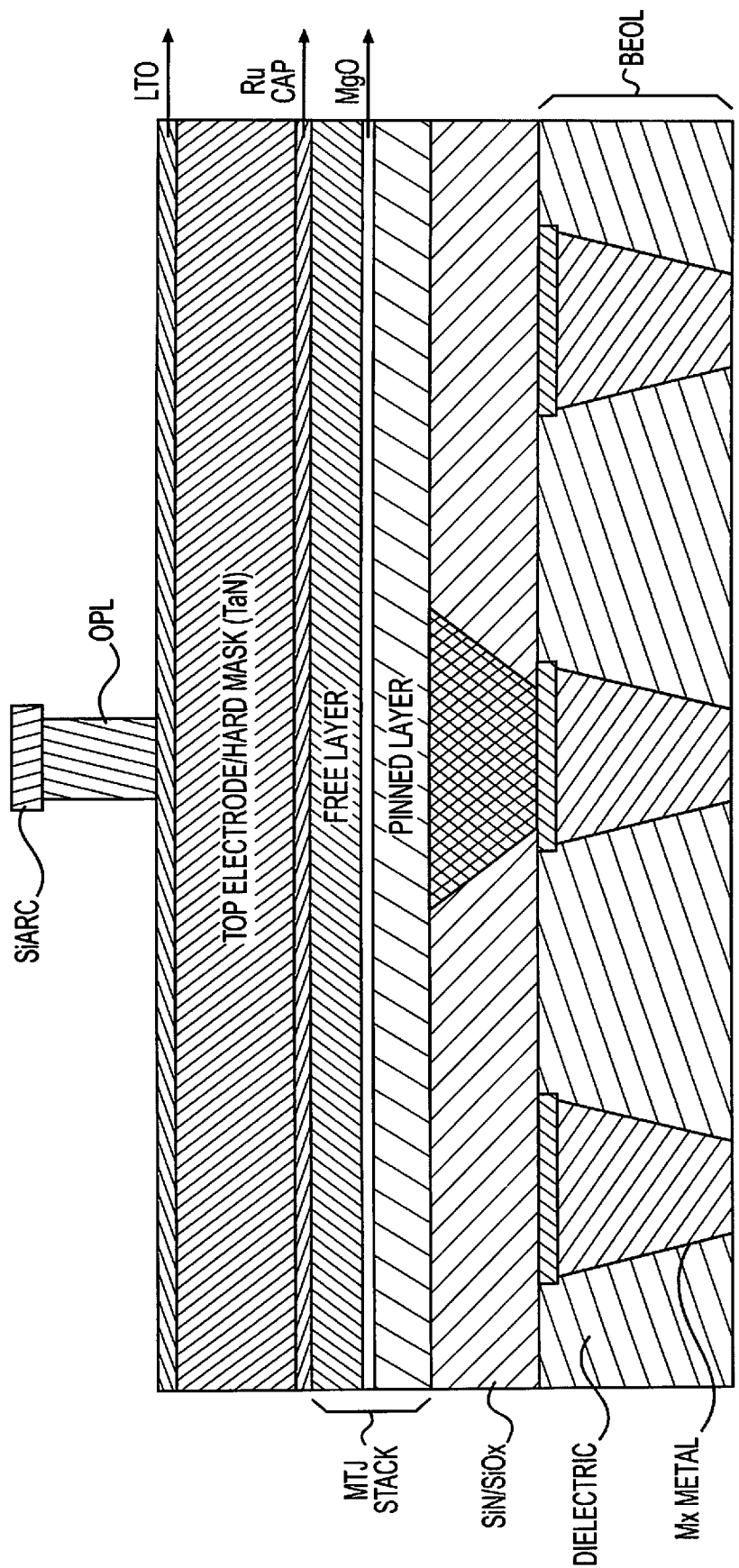

FIG. 15 illustrates a side elevation in cross-section of layers of a microcircuit device or module in a second process flow outline that comprises MTJ patterning to form the MTJ of the present invention where we first deposit a magnetic tunnel junction (MTJ stack) on the surface of a SiN substrate having opposing Mx metal posts in a dielectric matrix. We then deposit a TaN layer which serves as a hardmask and top electrode over the MTJ stack. We use a pillar mask (negative image of the hole mask to define the MTJ Pillar A pillar in this case comprises a cylindrical geometry (the inverse of a hole), i.e., a cylindrical space in an otherwise solid layer, whereas the pillar comprises a solid artifact in an otherwise empty space/plane.

Figure 16:
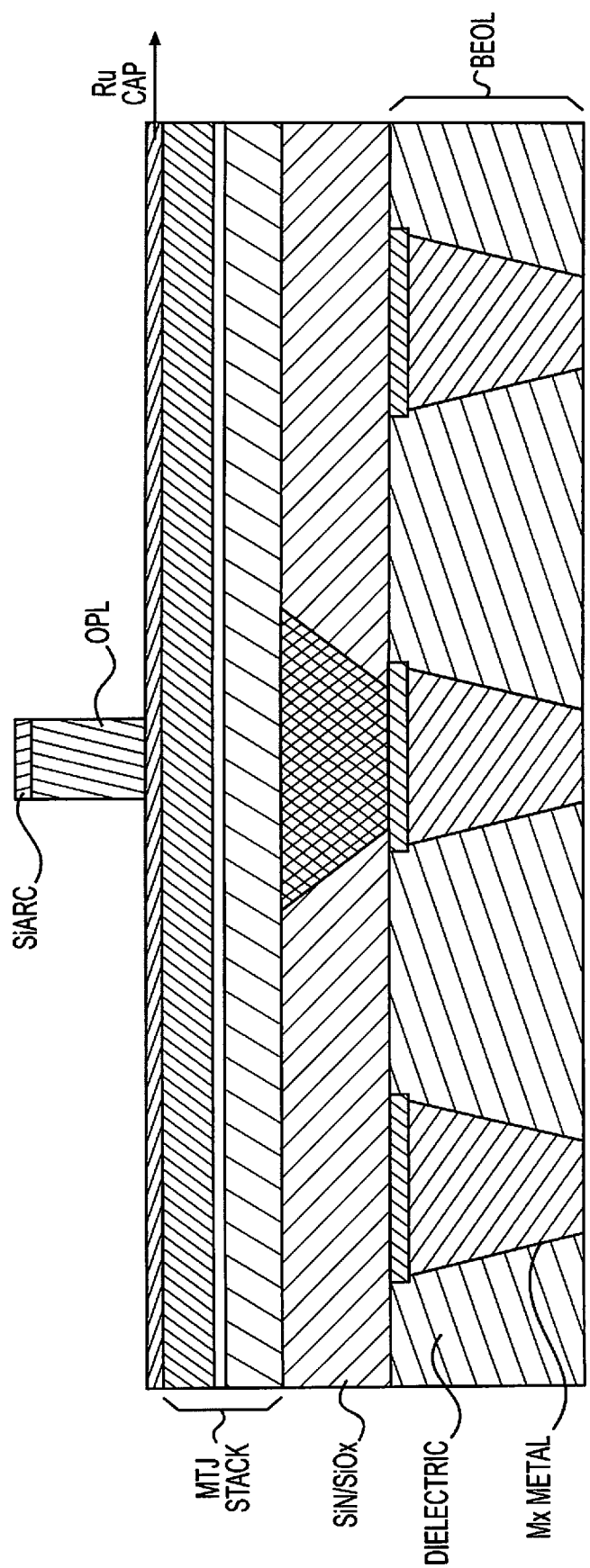

FIG. 16 illustrates a side elevation in cross-section of layers of a microcircuit device or module in the MTJ patterning, wherein we process the module of FIG. 15 by etching the LTO and TaN using $Cl_2/CHF_3$ chemistry. The Ru cap serves as a good stop layer for Cl/F chemistries and protects the MTJ layer from damage due to diffusion of those reactants. We then subject the wafers to a downstream plasma ($H_2O/N_2$) to passivate remnant surface Cl. Next, we strip the OPL using an $O_2$ plasma, followed by rinsing with DI Water (deionized water), a critical step to prevent residual Cl corrosion.

Figure 17:
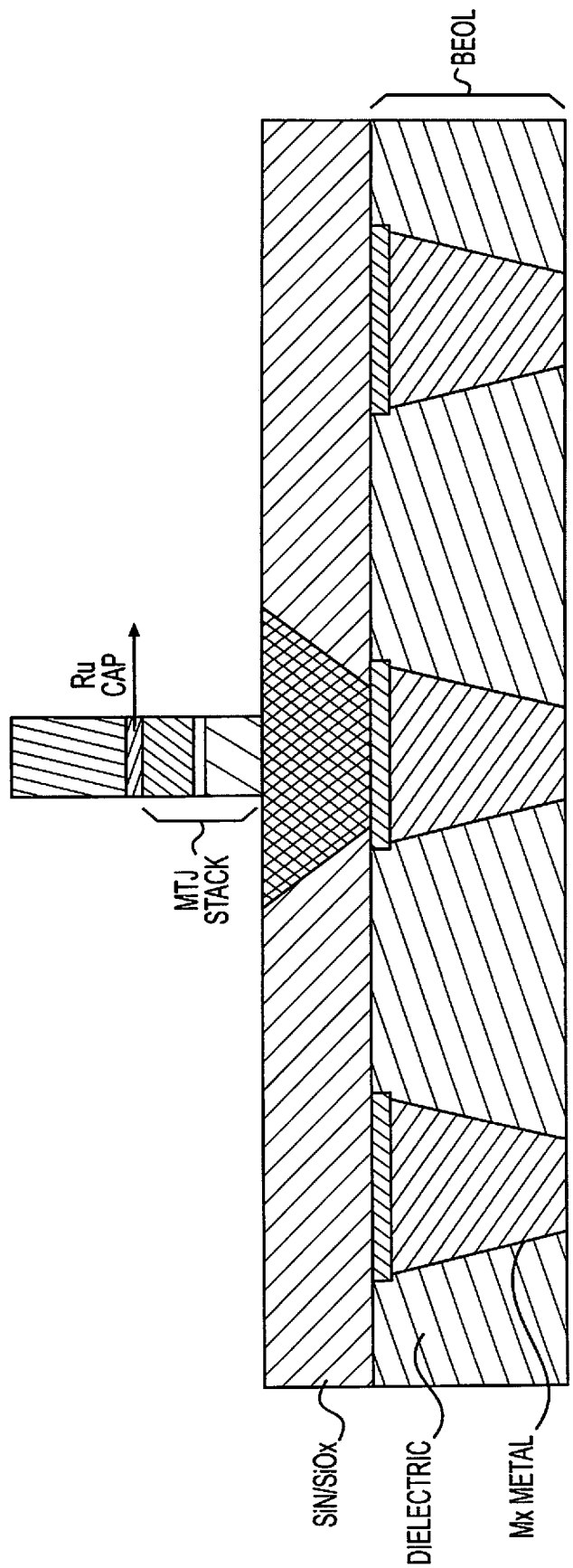

FIG. 17 illustrates a side elevation in cross-section of layers of a microcircuit device or module in the MTJ patterning, wherein we process the module of FIG. 16 by etching the MTJ stack using a physical sputtering process carried out using methanol or a a low molecular weight alkanol, (e.g., an alkanol having from 1 to about 4 carbon atoms) sputter reactive ion etch or IBE (Argon). IBE or ion beam etching, comprises a physical etch process using an ionized inert gas (e.g., the so-called noble gases having atomic numbers 2, 10, 18, 36, 54. and 86), with the ion energy controlled precisely through a series of extraction grids so all incident ions reaching the surface have more or less the defined energy value. IBE differs from a plasma or RIE in that IBE does not contain various neutral species, electrons, and the like found in plasma and RIE processes.

Throughout this specification, the inventors have set out equivalents, of various materials as well as combinations of elements, materials, compounds, compositions, conditions, processes, structures and the like, and even though set out individually, also include combinations of these equivalents such as the two component, three component, or four component combinations, or more as well as combinations of such equivalent elements, materials, compositions conditions, processes, structures and the like in any ratios or in any manner.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" as applied to any claim or any parameters herein, such as a numerical value, including values used to describe numerical ranges, means slight variations in the parameter. In another embodiment, the terms "about," "substantial," or "substantially," when employed to define numerical parameter include, e.g., a variation up to five per-cent, ten per-cent, or 15 per-cent, or somewhat higher.

All scientific journal articles and other articles, including internet sites, as well as issued and pending patents that this written description or applicants' Invention Disclosure Statements mention, including the references cited in such scientific journal articles and other articles, including internet sites, and such patents, are incorporated herein by reference in their entirety and for the purpose cited in this written description and for all other disclosures contained in such scientific journal articles and other articles, including internet sites as well as patents and the references cited therein, as all or any one may bear on or apply in whole or in part, not only to the foregoing written description, but also the following claims, and abstract of the disclosure.

We claim the invention as a product by process since the exact nature of metal-to-metal contact in the structures or articles of manufacture formed by the process of the invention becomes difficult to describe as to whether the metals form an alloy or a mixture of metals at the point where they contact or substantially a metal-to-metal contact without substantial, if any, alloy or mixed metal formation.

Any statement or statements made in this specification in the singular also includes or include the plural and vice-versa. The use of any personal pronouns in this specification refers to the inventors named in this specification.

Although the inventors have described their invention by reference to some embodiments, other embodiments defined by the doctrine of equivalents are intended to be included as falling within the broad scope and spirit of the foregoing written description, and the following claims, and abstract of the disclosure, and the appended drawings.

We claim:

1. A process for forming a device comprising:
    forming a plurality of metal posts in a substrate;
    depositing a dielectric layer over the metal posts and the substrate;
    etching the dielectric layer using a fluorocarbon plasma chemistry with a degree of polymerization selected to form a tapered opening by deposition reactions occurring during the etching; and
    depositing a conductive metal into the tapered opening to form a tapered VA bottom electrode contact structure comprising a bottom critical dimension (CD) is smaller than a top CD;
    forming a plurality of layers forming a magnet junction (MTJ) stack over the device including the conductive metal and the dielectric layer;
    forming a plurality of hardmask posts over the MTJ stack; and
    patterning the MTJ stack using the plurality of hardmask posts to form MTJ devices by a physical sputtering process, whereby sidewalls of the MTJ devices have minimized or substantially no coating of the conductive metal due to the physical sputtering process.

2. The process of claim 1 wherein the fluorocarbon plasma chemistry comprises a fluorocarbon or a mixture of fluorocarbons.

3. The process of claim 1 wherein the fluorocarbon plasma chemistry comprises a mixture comprising CF4 and $CHF_3$ fluorocarbons.

4. The process of claim 1 wherein said conductive metal comprises an electrically conductive metal, metal mixture, metal alloy, or metal compound.

5. The process of claim 1 wherein the plurality of hardmask posts are misaligned with the tapered VA bottom electrode contact structure, wherein the tapered VA bottom electrode contact structure minimizes or substantially prevents the coating of the conductive metal on the sidewalls of the MTJ devices due to the physical sputtering process.

6. The process of claim 1 wherein the fluorocarbon plasma chemistry comprises a CxHyFz fluorocarbon wherein x has a value of from 1 to about 2, y has a value of from 1 to about 3, and z has a value of from 1 to about 4.

7. The process of claim 6 wherein the fluorocarbon plasma chemistry comprises a mixture comprising CF4 and $CHF_3$ fluorocarbons in a ratio of about 1:4, plus or minus about 10 to about 20 percent.

8. A process for forming a device comprising:
    forming a plurality of metal posts in a substrate;
    depositing a dielectric layer over the metal posts and the substrate;
    etching the dielectric layer using a plasma chemistry with a degree of polymerization selected to obtain a tapered opening in the dielectric layer by deposition reactions occurring during the etching, where a bottom critical dimension (CD) of the tapered opening is smaller than a top CD of the tapered opening; and depositing an electrically conductive metal into the tapered opening to form a tapered VA bottom electrode contact structure;

forming a plurality of layers forming a magnet junction (MTJ) stack over the device including the electrically conductive metal and the dielectric layer;

forming a plurality of hardmask posts over the MTJ stack; and patterning the MTJ stack using the plurality of hardmask posts as a mask to form MTJ devices by a physical sputtering process, whereby sidewalls of the MTJ devices have minimized or substantially no coating of the conductive metal due to the physical sputtering process.

9. The process of claim 8 wherein the plasma chemistry comprises a fluorocarbon or a mixture of fluorocarbons.

10. The process of claim 8 wherein the plasma chemistry comprises a $C_xH_yF_z$ fluorocarbon wherein x has a value of from 1 to about 2, y has a value of from 1 to about 3, and z has a value of from 1 to about 4.

11. The process of claim 8 wherein the plasma chemistry comprises a mixture comprising $CF_4$ and $CHF_3$ fluorocarbons.

12. The process of claim 8 wherein the plasma chemistry comprises a mixture comprising $CF_4$ and $CHF_3$ fluorocarbons in a ratio of about 1:4, plus or minus about 10 to about 20 percent.

13. The process of claim 8 wherein said electrically conductive metal comprises an electrically conductive metal, metal mixture, metal alloy, or metal compound.

14. The process of claim 8 wherein the plurality of hardmask posts are misaligned with the tapered VA bottom electrode contact structure, wherein the tapered VA bottom electrode contact structure minimizes or substantially prevents the coating of the conductive metal on the sidewalls of the MTJ devices due to the physical sputtering process.

* * * * *